(12) United States Patent
Dunn

(10) Patent No.: US 6,256,866 B1
(45) Date of Patent: Jul. 10, 2001

(54) POLYMER THICK-FILM RESISTOR PRINTED ON PLANAR CIRCUIT BOARD SURFACE

(75) Inventor: Gregory Dunn, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/309,457

(22) Filed: May 11, 1999

(51) Int. Cl.[7] .................................................. H01C 17/28
(52) U.S. Cl. ............................ 29/621; 29/620; 174/257; 338/309; 361/766
(58) Field of Search ............................. 29/621, 852, 620, 29/611; 174/253, 256, 257; 427/96; 338/309; 361/765, 766

(56) References Cited

U.S. PATENT DOCUMENTS

| | | | |
|---|---|---|---|
| 4,241,103 | * 12/1980 | Ohkubo et al. | 29/611 |
| 4,685,203 | * 8/1987 | Takada et al. | 29/620 |
| 5,270,493 | * 12/1993 | Inoue et al. | 174/253 |
| 5,347,258 | 9/1994 | Howard et al. | |
| 5,347,712 | * 9/1994 | Yasuda et al. | 29/852 |
| 5,603,847 | 2/1997 | Howard et al. | |
| 5,624,258 | 4/1997 | Hayakawa et al. | |
| 5,716,663 | * 2/1998 | Capote et al. | 427/96 |
| 5,758,413 | * 6/1998 | Chong et al. | 29/852 |

* cited by examiner

Primary Examiner—Lee Young
Assistant Examiner—Rick Kiltae Chang
(74) Attorney, Agent, or Firm—Douglas D. Fekete

(57) ABSTRACT

A method of manufacturing a printed circuit board with a polymer thick-film (PTF) resistor whose dimensions can be defined with improved precision by providing a circuit board construction having a planar surface where the resistor is to be deposited. To achieve the desired board construction, the interconnect for the resistor is pattern plated using a permanent photodielectric layer as a plating mask instead of a sacrificial plating resist. The interconnect can be patterned before or after the PTF resistor ink is printed. The x and z dimensions (width and thickness, respectively) of the resistor are determined by the deposition process, while the y dimension (electrical length) is accurately determined by copper terminations.

6 Claims, 2 Drawing Sheets

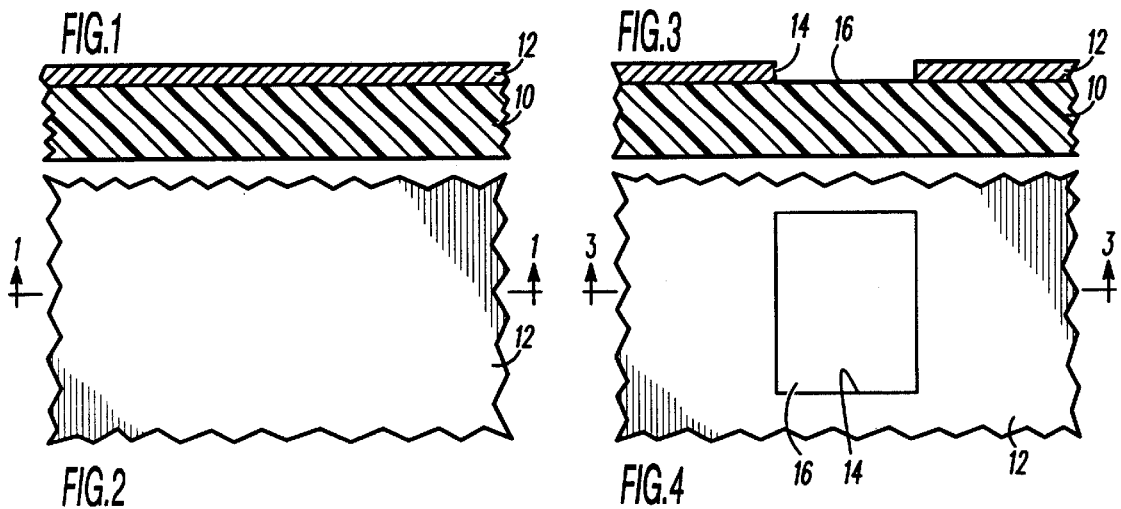
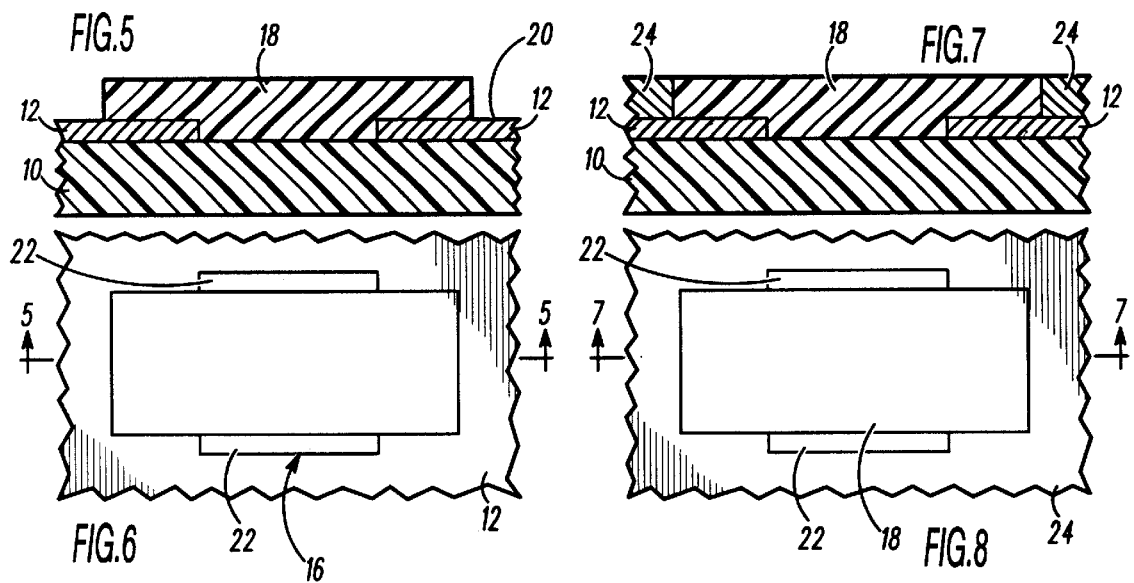

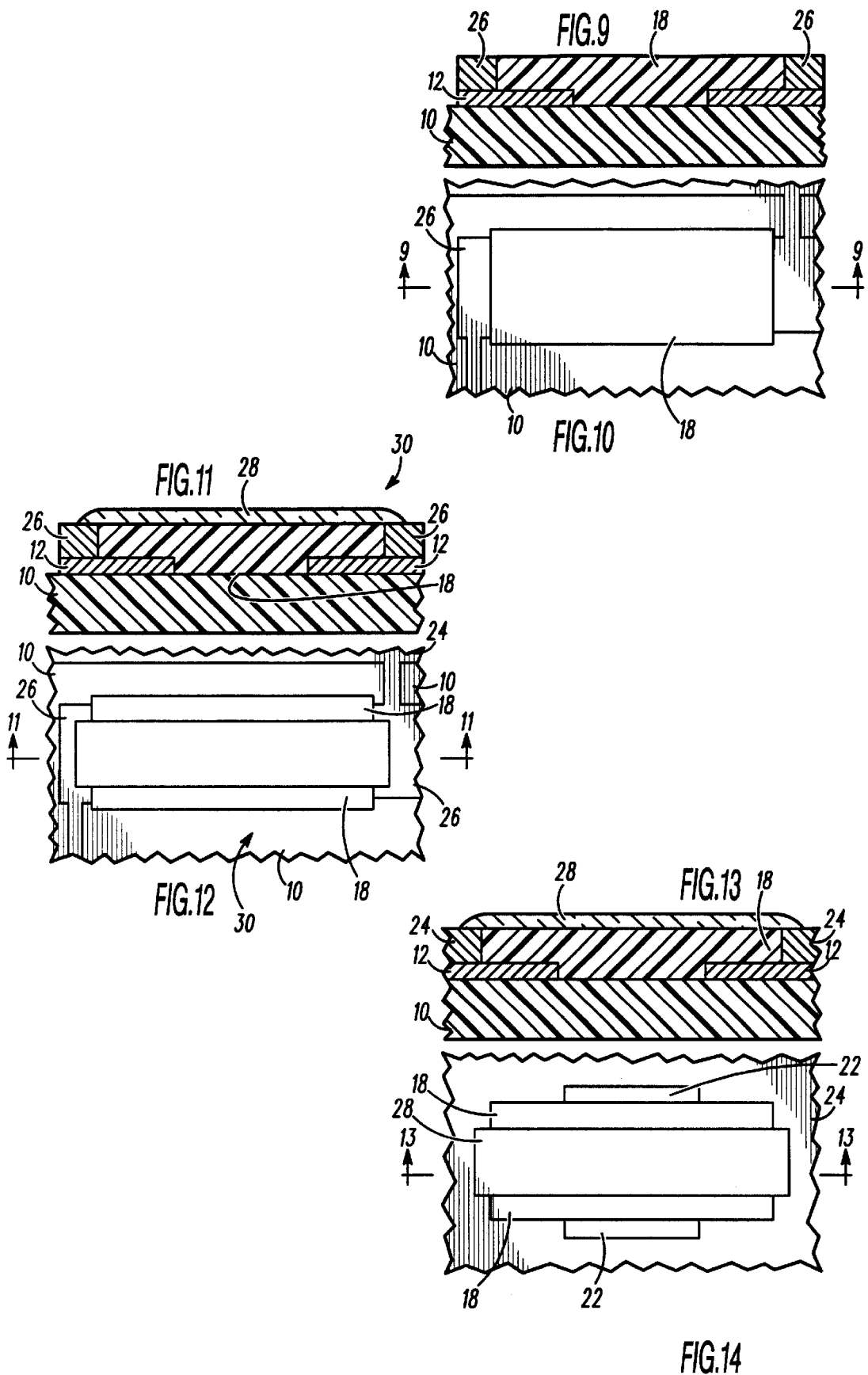

POLYMER THICK-FILM RESISTOR PRINTED ON PLANAR CIRCUIT BOARD SURFACE

This invention was made with Government support under Agreement No. F33615-96-2-1838 awarded by DARPA. The Government has certain rights in the invention.

BACKGROUND OF THE INVENTION

1. Field of the Invention

The present invention generally relates to electrical circuit boards and their fabrication. More particularly, this invention relates to a method for providing a planar surface on a circuit board to allow screen printing a polymer thick-film resistor with improved dimensional and electrical tolerances.

2. Description of the Prior Art

Thick-film resistors are employed in hybrid electronic circuits to provide a wide range of resistor values. Such resistors are formed by printing, such as screen printing, a thick-film resistive paste or ink on a substrate, which may be a printed wiring board (PWB), flexible circuit, or a ceramic or silicon substrate. Thick-film inks used in organic printed wire board construction are typically composed of an electrically-conductive material, various additives used to favorably affect the final electrical properties of the resistor, an organic binder and an organic vehicle. After printing, the thick-film ink is typically heated to dry the ink and convert it into a suitable film that adheres to the substrate. If a polymer thick-film (PTF) ink is used, the organic binder is a polymer matrix material and the heating step serves to remove the organic vehicle and cure the polymer matrix material.

The electrical resistance of a thick-film resistor is dependent on the precision with which the resistor is produced, the stability of the resistor material, and the stability of the resistor terminations. The "x" and "z" dimensions (the width and thickness, respectively, of the resistor) of a rectangular PTF resistor are typically determined by a screen printing process, while the "y" dimension (the electrical length of the resistor) is determined by the resistor termination pattern. Conventional screen printing techniques generally employ a template with apertures bearing the positive image of the resistor to be created. The template, referred to as a screening mask, is placed above and in close proximity to the surface of the substrate on which the resistor is to be formed. The mask is then loaded with a PTF resistive ink, and a squeegee blade is drawn across the surface of the mask to press the ink through the apertures and onto the surface of the substrate. Copper terminations are typically formed prior to deposition of the ink by additive plating or electrolytic panel plating with subtractive etching, both of which are capable of achieving a high level of edge definition that enables accurate determination of the electrical length (y) of the resistor.

Compared to many other deposition processes, screen printing is a relatively crude process. As a result, screen-printed PTF resistors are typically limited to dimensions of larger than about one millimeter, with dimensional tolerances generally being larger than about ±10% at this lower limit. While the y dimension (electrical length) of a screen-printed PTF resistor can be accurately determined by using appropriate processes to form the terminations, control of the x and z (width and thickness) dimensions of a PTF resistor is fundamentally limited by the relatively coarse mesh of the screen and by ink flow after deposition. Control of resistor dimensions is further complicated by the variability of the surface on which the resistive ink is printed, due in large part to patterned copper interconnects for these resistors having typical thicknesses of about ten to thirty-five micrometers. The interconnect prevents a smooth squeegee action across the surface, resulting in imperfect printing of the screen image and non-uniform deposition of the resistor ink. Consequently, resistance tolerances of less than ±20% are difficult to achieve with screen-printed PTF resistors without laser trimming, an operation that is usually cost prohibitive for complex circuits.

From the above, it can be seen that what is needed is a method for forming PTF resistors with more accurate dimensions. Fully additive electroless plating can be used to produce copper interconnect that is substantially coplanar with the dielectric, yielding a planar board surface that enables improved printing precision. However, electroless plating is a very slow and expensive process compared to electrolytic panel plating and subsequent subtractive etching.

SUMMARY OF THE INVENTION

According to the present invention, there is provided a method of manufacturing a printed circuit board with a polymer thick-film (PTF) resistor whose dimensions can be defined with improved precision by providing a circuit board construction having a planar surface where the resistor is to be deposited. To achieve the desired board construction, the interconnect for the resistor is electrolytically pattern plated using a permanent photodielectric layer as a plating mask instead of a sacrificial plating resist. The interconnect can be patterned before or after the PTF resistor ink is printed. The x and z dimensions (width and thickness, respectively) of the resistor are determined by the deposition process, while the y dimension (electrical length) is accurately determined by copper terminations.

The method of this invention generally entails forming a first electrically-conductive layer on a dielectric substrate, forming an opening in the first electrically-conductive layer to expose a surface portion of the substrate, and then forming a dielectric layer that covers a part of the exposed surface portion of the substrate and preferably adjacent surface portions of the first electrically-conductive layer, while exposing a surface portion of the first electrically-conductive layer. Using the dielectric layer as a mask, a second electrically-conductive layer is then deposited on the first electrically-conductive layer so that the dielectric layer and the second electrically-conductive layer define a substantially coplanar surface. In a preferred embodiment, portions of the first and second electrically-conductive layers are then removed to define a pair of terminations separated by the dielectric layer, after which a polymer thick-film resistive material is screen printed on the dielectric layer and the terminations to define a polymer thick-film resistor. Alternatively, the polymer thick-film resistive material can be screen printed on the dielectric layer and the second electrically-conductive layer prior to the terminations being defined.

From the above, those skilled in the art will appreciate that the method of this invention is able to produce PTF resistors whose thickness can be more accurately controlled as a result of the thick-film resistor ink being deposited on a substantially planar surface region. In the preferred embodiment, though the surface area of the planar surface region is relatively smaller for a given resistor size than that possible with the alternative embodiment, a significant improvement in thickness control is nonetheless achieved because sufficient local planarity is provided between and including the terminations. An additional advantage of the preferred embodiment is that the PTF resistor can be tested immediately after printing.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing, in which:

FIGS. 1 through 12 are cross-sectional and plan views of process steps employed in the fabrication of a screen-printed PTF resistor in accordance with a preferred embodiment of this invention; and FIGS. 13 and 14 are cross-sectional and plan views, respectively, of an alternative process step to that shown in FIGS. 9 and 10.

DETAILED DESCRIPTION OF THE PREFERRED EMBODIMENT

Processing steps for producing a polymer thick-film (PTF) resistor in accordance with this invention are generally represented in FIGS. 1 through 12, with an alternative process step to that of FIGS. 9 and 10 being shown in FIGS. 13 and 14. The processes described and represented in the Figures achieve the advantageous features of this invention in reference to forming PTF resistors with improved thickness tolerances. While a particular resistor configuration is shown in the Figures, those skilled in the art will appreciate that numerous variations and modifications are possible, and such variations and modifications are within the scope of this invention.

Referring to FIGS. 1 and 2, a dielectric substrate 10 is shown on which a copper film 12 has been formed. Generally, the substrate 10 can be any suitable material, including a printed wiring board, a flexible circuit, a ceramic or silicon substrate, or another dielectric layer of a multi-layer circuit, though other suitable substrates and materials could also be used. The copper film 12 can be formed by such methods as electroless plating, electroplating, or lamination of a copper foil, with suitable thickness range for the film 12 being about one to about thirty micrometers. While a copper film 12 is preferred, those skilled in the art will appreciate that the film 12 could be formed of another suitable conductive material, such as nickel.

The result of a selective etch of the copper film 12 is shown in FIGS. 3 and 4, by which an opening 14 is patterned in the copper film 12 to expose a surface region 16 of the substrate 10. Conventional masking and etching techniques can be used for this step of the process, and therefore will not be discussed in any further detail. FIGS. 5 and 6 show the result of a dielectric layer 18 being selectively formed on portions of the copper film 12 and exposed surface region 16 of the substrate 10. The dielectric layer 18 is preferably formed of a photoimageable thickfilm polymer, such that known photoimaging and development techniques can be employed to pattern the layer 18 as shown in FIGS. 5 and 6. Suitable thick-film polymer compositions typically include a resin, photosensitive agents and hardeners. The resin component can be any suitable liquid resin or solid resin, so as to enable the resin mixture to be readily deposited onto the surfaces of the copper film 12 and region 16 in liquid form or as a laminate to form the dielectric layer 18. Resins that could be used include thermoplastic resins, thermosetting resins, elastomers and mixtures thereof, which when incorporated with a photosensitive material yield a photoimageable composition. Desirable properties for the thick-film polymer include physical properties that remain stable throughout deposition and photoimaging of the dielectric layer 18 and, because the layer 18 is to serve as a permanent dielectric layer of the circuit structure, also remain stable in the operating environment of the circuit structure. For these reasons, epoxies are particularly suitable as the resin for the dielectric layer 18, with preferred epoxy-base compositions being PROBELEC® commercially available from Ciba-Geigy, and VIALUX 81, a dry film material commercially available from E. I. du Pont de Nemours & Company.

As seen in FIG. 6, the dielectric layer 18 has been photoimaged and developed so that it covers a limited area of the surface region 16 exposed by the opening 14 and limited surface portions of the copper film 12 on opposite sides of the opening 14. More particularly, the dielectric layer 18 covers a mid-section of the surface region 16 and two edge regions of the copper film 12 that are adjacent the mid-section of the surface region 16 and separated by the mid-section and the opening 14. The dielectric layer 18 preferably overlies the edge regions of the copper film 12 as shown to allow for misalignment. As a result of the opening 14, the copper film 12 underlying the dielectric layer 18 is not continuous so as not to short the resistor 30 that will be formed on the dielectric layer 18, as seen in FIGS. 11 and 12. Remaining exposed by the dielectric layer 18 are two side areas 22 of the surface region 16 separated by the dielectric layer 18, and at least a portion of the surface 20 of the copper film 12 surrounding the dielectric layer 18. The purpose of the side areas 22 is to allow for misalignment of the dielectric layer 18.

The configuration shown in FIGS. 5 and 6 allows electrolytic plating of additional copper on the copper film 12 as a result of there being electrical continuity throughout the film 12, so that an electrical potential can be applied and maintained during electroplating. FIGS. 7 and 8 show a copper layer 24 that has been deposited on the exposed surface 20 of the copper film 12 so that the dielectric layer 18 and the copper layer 24 define a substantially coplanar surface, as most readily apparent from FIG. 7. The copper layer 24 is preferably formed by electroplating the copper film 12 (i.e., "panel plating"), using the permanent dielectric layer 18 as a plating resist. As seen in FIG. 8, the copper layer 24 does not deposit on the two exposed areas 22 of the substrate 10. A suitable thickness range for the dielectric and copper layers 18 and 24 is about ten to about fifty micrometers.

In FIGS. 9 and 10, the copper layer 24 has been patterned to form a pair of terminations 26 at opposite ends of the dielectric layer 18. The copper layer 24 can be patterned in any suitable manner, such as by applying and patterning a photoresist, and then etching the exposed portions of the copper layer 24. As a result of the copper layer 24 being substantially coplanar with the dielectric layer 18 (FIG. 7), the terminations 26 are also substantially coplanar with the dielectric layer 18 as seen in FIG. 9. FIGS. 11 and 12 illustrate the result of a final step of the process, by which a polymer thick-film resistive material 28 has been deposited on the dielectric layer 18 and terminations 26 to form a polymer thick-film resistor 30. FIG. 11 illustrates the importance of patterning the opening 14 in the copper film 12 to prevent short circuiting between the terminations 26. Because the dielectric layer 18 and terminations 26 provide local planarity, the resistive material 28 can be screen printed more uniformly than possible with prior art screen printing techniques used to form PTF resistors. The local planarity is also beneficial for depositing the resistive material 28 by other methods, such as stenciling or direct-write deposition with a micropen or any other suitable instrument. In accordance with conventional practices, the x dimension (width) of the resistor 30 is determined by the deposition process, while the y dimension (electrical length) is established by the copper terminations 26 whose locations on the board structure were accurately determined by the photoimaging process used to pattern the dielectric layer 18. The resistive material 28 can be essentially any PTF resistor ink that can be suitably deposited by screen printing or the deposition method of choice. An example of inks suitable for screen printing is the TU-00-8 ink series commercially available from Asahi Chemical Research Company of Tokyo, Japan.

In view of the process steps of FIGS. 1 through 12, the terminations 26 and the interconnect formed by the remaining portions of the copper layer 24 are defined prior to deposition of the resistive material 28, which allows the resistor 30 to be immediately tested. In an alternative embodiment shown in FIGS. 13 and 14, the resistive material 28 is screen printed prior to etching the copper layer 24. The result of copper etching the structure shown in FIGS. 13 and 14 is essentially identical to what is shown in FIGS. 11 and 12. An advantage of this alternative process step of the invention is that a larger planar area is provided for improved control of the thickness of the screen-printed resistive material 28. However, a resulting limitation is that the resistor 30 is shorted with other components of the circuit by the continuous conductive field formed by the copper layer 24, which prevents electrical testing of the resistor 30 at the time of printing.

While the invention has been described in terms of particular embodiments, it is apparent that other forms could be adopted by one skilled in the art. Accordingly, the scope of the invention is to be limited only by the following claims.

What is claimed is:

1. A method of manufacturing a printed circuit board, the method comprising the steps of:

forming a first conductive layer on a dielectric substrate, the first conductive layer having an opening therein that exposes a region of the substrate, the exposed region having two side sections separated by a mid-section, the first conductive layer having two edge regions adjacent the mid-section of the exposed region and separated by the opening and the mid-section of the exposed region;

forming a dielectric layer that covers the mid-section of the exposed region of the substrate, the dielectric layer having two end sections that cover the two edge regions of the first conductive layer, the first conductive layer having a surface region left exposed by the dielectric layer;

depositing a second conductive layer on at least a portion of the surface region adjacent the two end sections of the dielectric layer such that the second conductive layer is deposited so that the dielectric layer and the second conductive layer define a substantially coplanar surface;

removing a portion of the second conductive layer and a portion of the first conductive layer so as to define a pair of terminations separated by the dielectric layer; and then depositing a polymer thick-film resistive material on the dielectric layer and the terminations so as to define a polymer thick-film resistor.

2. The method according to claim 1, wherein the first conductive layer is formed by a method chosen from the group consisting of electroless plating, electroplating, and laminating.

3. The method according to claim 1, wherein the second conductive layer is deposited by electroplating.

4. The method according to claim 1, wherein the polymer thick-film resistive material is deposited by screen printing.

5. The method according to claim 1, wherein the dielectric layer is formed by depositing a photodielectric material on the first conductive layer, and then photoimaging and developing the photodielectric material to define the dielectric layer.

6. A method of manufacturing a printed circuit board, the method comprising the steps of:

forming a first copper layer on a dielectric substrate;

etching an opening in the first copper layer to expose a region of the substrate, the exposed region having two side sections separated by a mid-section, the first copper layer having two edge regions adjacent the mid-section of the exposed region and separated by the opening and the mid-section of the exposed region;

depositing a photodielectric layer on the first copper layer and the exposed region of the substrate;

photoimaging and developing the photodielectric layer so that the photodielectric layer covers only the mid-section of the exposed region and the two edge regions of the first copper layer while exposing the two side sections of the exposed region and a surface region of the first copper layer;

electroplating a second copper layer on at least a portion of the surface region adjacent the two end sections of the dielectric layer so that the photodielectric layer and the second copper layer define a substantially coplanar surface;

removing a portion of the second copper layer so as to define a pair of terminations separated by the photodielectric layer; and then screen printing a polymer thick-film resistive material on the photodielectric layer and the terminations so as to define a polymer thick-film resistor.

* * * * *